(12) United States Patent
Chan et al.

(10) Patent No.: US 6,411,665 B1
(45) Date of Patent: Jun. 25, 2002

(54) PHASE LOCKED LOOP CLOCK EXTRACTION

(75) Inventors: Joseph Chan, Harrow; Richard Francis Bastable, Tonbridge, both of (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/268,523

(22) Filed: Mar. 11, 1999

(30) Foreign Application Priority Data

Dec. 21, 1998 (GB) ............................................... 9828196

(51) Int. Cl.[7] .............................................. H03K 19/00
(52) U.S. Cl. ........................ 375/360; 375/327; 375/376
(58) Field of Search ................................ 375/359, 360, 375/376, 355, 356, 357, 326, 327, 374, 375; 327/100, 141, 147, 155, 156, 159

(56) References Cited

U.S. PATENT DOCUMENTS

| 5,224,130 A | | 6/1993 | Mayo et al. ................. 375/120 |
| 5,502,409 A | * | 3/1996 | Schnizlein et al. ............ 327/99 |
| 5,826,106 A | * | 10/1998 | Pang ............................ 395/845 |
| 5,930,311 A | * | 7/1999 | Lovelace et al. ........... 375/354 |

FOREIGN PATENT DOCUMENTS

EP      0 557 856 A2     12/1999

OTHER PUBLICATIONS

"A Versatile Clock Recovery Architecture and Monolithic Implementation", Lawrence M. DeVito, p. 405 to 420.

* cited by examiner

Primary Examiner—Chi Pham
Assistant Examiner—Dung X. Nguyen
(74) Attorney, Agent, or Firm—Lee, Mann, Smith, McWilliams Sweeney & Ohlson

(57) ABSTRACT

A clock recovery circuit includes a phase locked loop in which the control voltage of a voltage controlled oscillator is controlled by a loop filter driven by the output of a phase comparator. During acquisition of the phase locked condition, a frequency error detector is used to detect frequency error and input a frequency error signal to a charge pump circuit associated with the loop filter. Frequency error is detected by a method of determining the phase quadrant of clock signal in which each transition of the data occurs, an algorithm implemented by logic circuit being utilized to selectively generate the frequency error signal only for certain defined transitions between phase quadrant values. Sampling of the phase quadrant values is effected by sampling sub-circuits using latched values of the clock and quadrature clock signals to obtain samples of the clock and quadrature clock signals for each transition, and subsequently determining the phase quadrant value by a logical combination of the samples. The method and apparatus have application in data recovery in optical communications systems operating in the GHz range.

5 Claims, 16 Drawing Sheets

PHASE LOCKED LOOP CIRCUIT

Fig 1    PHASE LOCKED LOOP CIRCUIT

Fig 4  PUMP CIRCUIT CONFIGURED FOR DIFFERENCE SIGNALS

Fig 5
QUADRATURE CLOCK SIGNAL GENERATOR
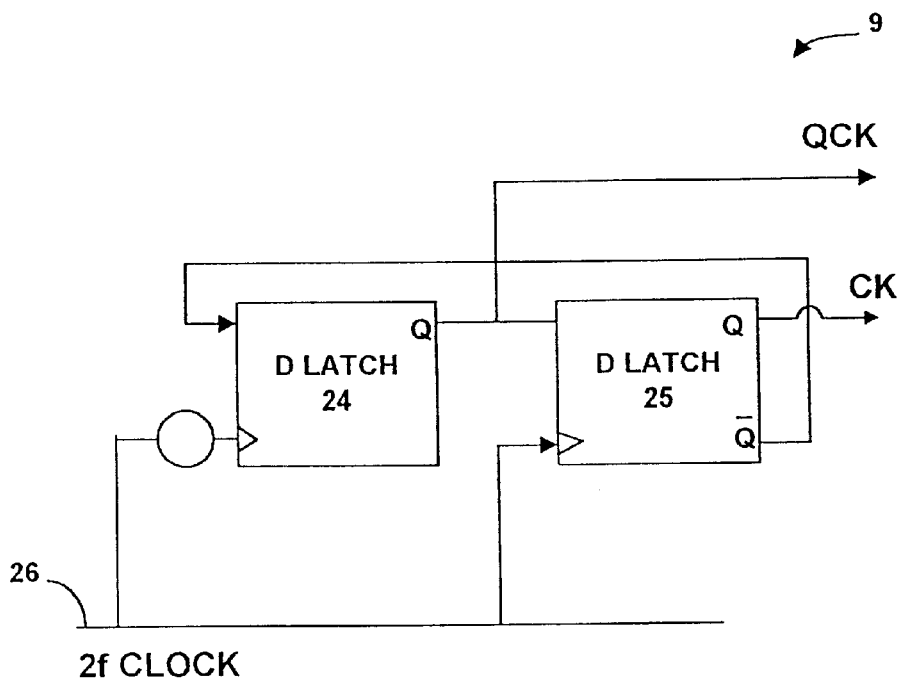
Fig 5A
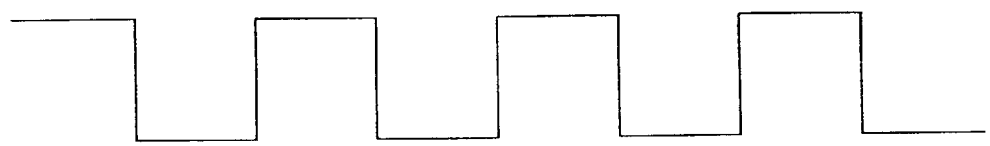
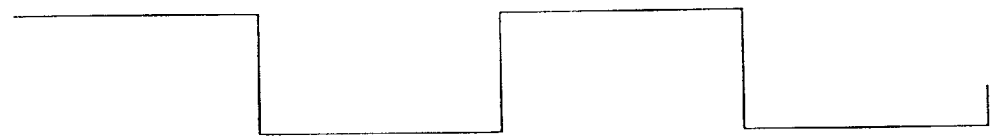

CLOCK SAMPLING SUBCIRCUIT

QCLOCK SAMPLING SUBCIRCUIT

FREQUENCY ERROR DETECTOR - GENERATION OF CONTROL SIGNAL FOR PUMP CIRCUIT

Fig 8 SAMPLING CLOCK AND QCLOCK SIGNALS TO OBTAIN PHASE QUADRANT VALUES
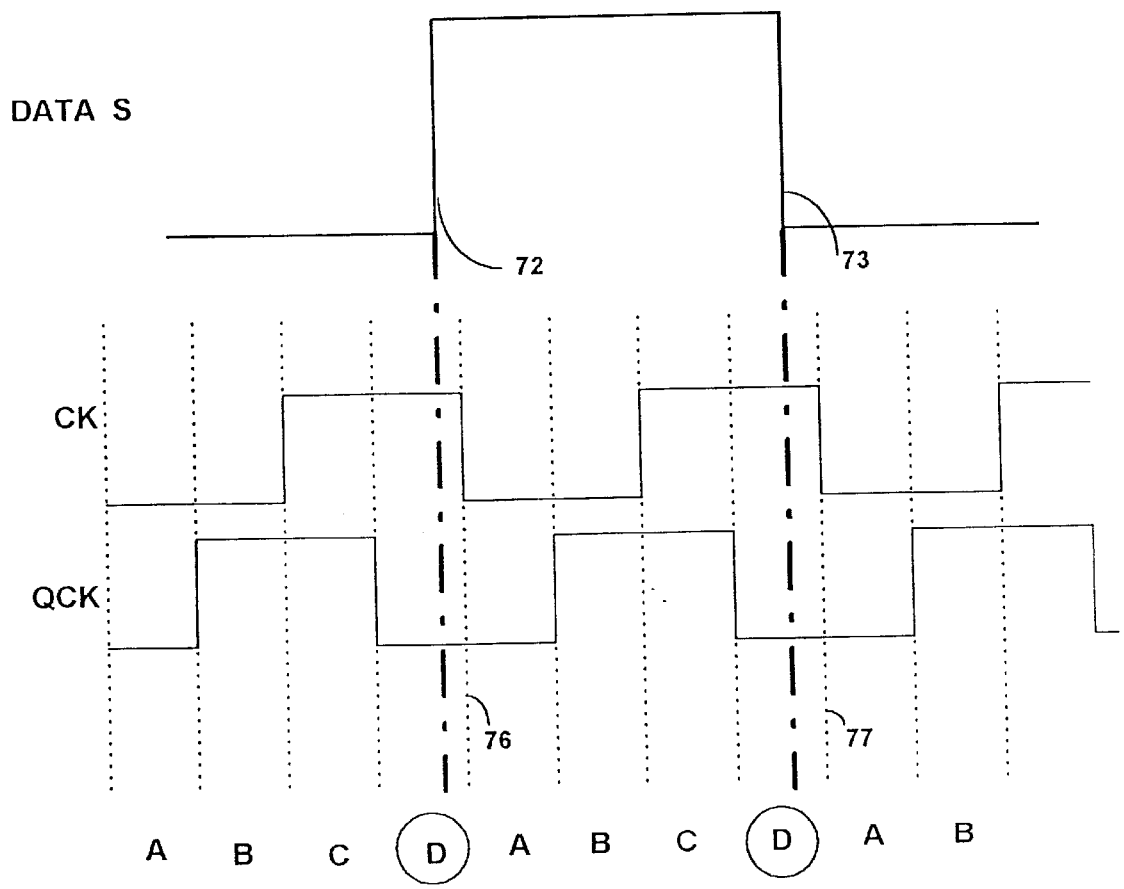
Fig 8A
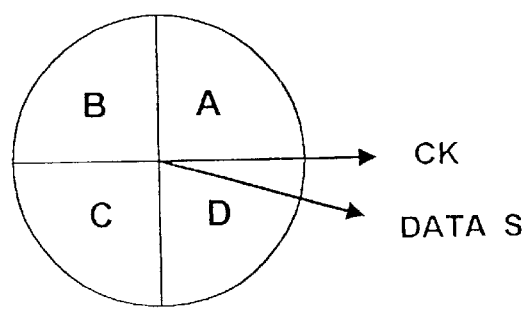

Fig 9   SAMPLING CLOCK AND QCLOCK SIGNALS TO OBTAIN PHASE QUADRANT VALUES
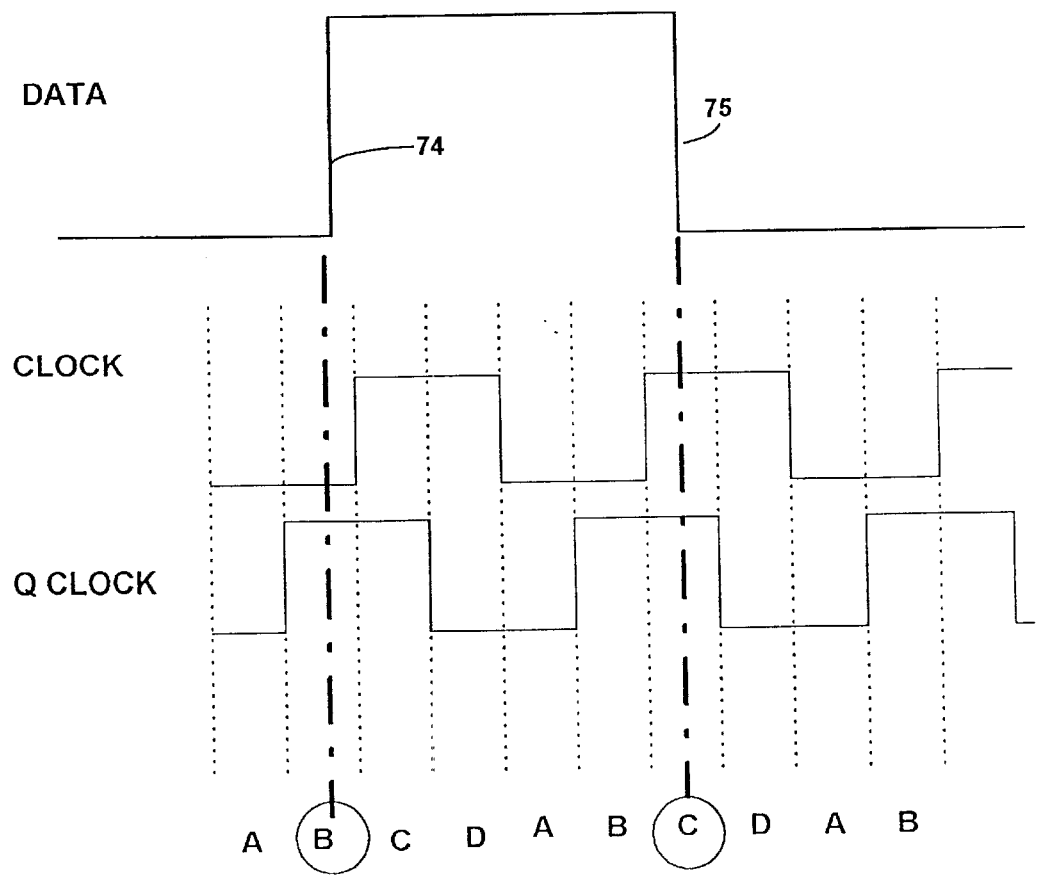
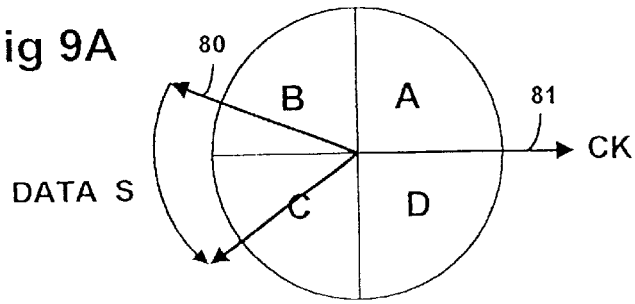

CIRCUIT TO GENERATE FREQUENCY ERROR SIGNAL

Fig 11  ALGORITHM TO DETERMINE FREQUENCY ERROR

PUMP CIRCUIT CONFIGURED FOR DIFFERENCE SIGNALS

PHASE LOCKED LOOP CLOCK EXTRACTION

BACKGROUND TO THE INVENTION

This invention relates to phased locked loop clock extraction and in particular, but not exclusively, to a sampling circuit for sampling clock signals relative to a data signal for determining phase quadrant values of the clock signal and to a frequency error detection circuit using the phase quadrant values.

It is known to utilize a phase locked loop as a means of clock recovery, as for example in the case of a data signal which is obtained by detecting an optical signal in an optical communications system, it being a general requirement at a receiver to synchronize a clock signal of the data signal before subsequent processing of the digital signal in the electrical domain. Typical data rates for such systems are in the range 1 to 10 GHz.

Phase locked loop circuits typically comprise a voltage controlled oscillator having an output which determines the clock frequency and an input voltage level set by a phase comparator and a loop filter. The phase comparator compares the phase of the clock signal with the data signal and, once the clock signal has initially been locked to the data signal, provides the necessary feedback via the loop filter to maintain the phase locked condition.

In order to provide improved response during initial acquisition of the phase lock condition, it also known to provide a frequency error detector which provides a frequency error signal representative of the difference in frequency between the clock frequency and the data rate, both phase error signals and frequency error signals being input to the loop filter during the acquisition phase.

It is known from EP-A-0557856 to discontinue input of the frequency error signal once the phase lock condition has been achieved in order to remove a source of jitter in the phase of the clock signal due to noise in the frequency error signal.

It is also known from Laurence DeVito, "A Versatile Clock Recovery Architecture and Monolithic Implementation", from a compilation by IEEE Press titled "Monolithic Phase-Locked Loops and Clock Recovery Circuits" edited by Behzad Razavi, to provide the frequency error signal by first sampling a phase quadrant value of the clock signal by means of a sampling circuit in which a monostable multivibrator produces a strobe pulse for each transition of the data signal and obtains phase quadrant values by strobing a quadrature clock signal with the strobe pulse. A frequency error is determined to exist when the phase quadrant value changes in a manner consistent with the existence of frequency error. Specifically, if four phase quadrants of the clock signal are represented by values A, B, C and D such that the phase locked condition corresponds to the AD quadrant boundary, the frequency error detection circuit of DeVito detects a frequency error to exist when the measured phase quadrant value moves from B to C or from C to B, representing clock "too fast" and clock "too slow" conditions respectively.

A problem associated with the sampling circuit of DeVito is that it utilises a difference gate receiving both the signal pulse and a delayed signal pulse to generate the strobe signal and that therefore successful operation of this circuit is particularly dependent upon the accuracy of the value of delay. If the delay is too short, the strobe pulses become too narrow for triggering subsequent sampling latches. If on the other hand the delay is too long, the delayed pulse will not overlap the data pulse and no output strobe signal will be obtained. In practice, it may be difficult to achieve satisfactory stable operation due to difficulties in accurately setting the delay period when operating at frequencies in the GHz range.

It is also known from Mayo, U.S. Pat. No. 5,224,130, assigned to the assignee of the present application, to provide clock extraction using a phase locked loop. When the loop is out of lock, a frequency error signal is generated using a coincidence detector receiving both the data signal and the outputs of latch circuits in which the data signal is latched with the clock and quadrature clock signals. The frequency error signal is determined according to a predetermined algorithm based on values of the data signal obtained from the latch outputs.

There remains a need to provide an improved clock recovery system based upon phase detection and utilising frequency error detection during acquisition of the phase lock condition.

SUMMARY OF THE INVENTION

It is an object of the present invention to provide an improved sampling circuit for sampling a phase quadrant value of a clock signal.

It is a further object of the present invention to provide an improved frequency error detection circuit for a phase locked loop clock recovery system which is disabled when the phase locked condition is acquired.

It is a further object of the present invention to provide an improved frequency error detection algorithm for deciding when a change in phase quadrant value represents a frequency error in a phase locked looped circuit and which is tolerant to jitter in the data signal.

It is a further object of the present invention to provide a phase locked looped circuit having a frequency error detector which is immune to self-oscillation.

According to the present invention there is disclosed a method of sampling a clock signal in a clock recovery circuit at times corresponding to transition events between first and second values of a data signal from which the clock signal is recovered, the method comprising the steps of;

inputting the clock signal to a first latch switched by the data signal between a transparent state when the data signal has the first value and a hold state when the data signal has the second value;

inverting the data signal and inputting the clock signal to a second latch clocked by the inverted data signal between a transparent state when the data signal has the first value and a hold state when the data signal has the second value; and multiplexing outputs of the first and second latches to select one of said outputs according to the value of the data signal to obtain a sampled output signal corresponding to the output of whichever one of the first and second latches is in the hold state.

Preferably the latches comprise transparent D type latches.

According to a further aspect of the present invention there is disclosed a method of operating a phase locked loop circuit to recover a clock signal from a received data signal in a clock recovery system, the method comprising the steps of;

determining a phase quadrant value representative of a quadrant of phase of the clock signal within which a transition event of the data signal occurs;

repeating the determining step for successive transition events to obtain a sequence of phase quadrant values;

determining the existence of a frequency error from changes in successive phase quadrant values in the sequence in accordance with a predetermined algorithm;

selectively generating a frequency error signal in accordance with said frequency error determination and inputting the frequency error signal to the phase locked loop circuit to change a frequency of oscillation of the circuit;

said algorithm being defined such that, if contiguous phase quadrant values are represented by A, B, C and D such that a transition between A and D corresponds to zero phase difference between the clock signal and data signal, a transition from A to B corresponds to the data being advanced relative to the clock signal, and a transition from C to D corresponds to the data being retarded relative to the clock signal, then (a) a frequency error signal representative of the clock signal being too fast is generated only if successive quadrant values comprise one of:
(i) a change from B to C; and
(ii) a change from B to D; and (b) a frequency error signal representative of the clock frequency being too slow is generated only if successive quadrant values comprise one of:
(i) a change from C to B; and
(ii) a change from C to A.

According to a further aspect of the present invention there is disclosed a method of operating a phase-locked loop circuit for a clock recovery system, the method comprising the steps of:

generating a clock signal by operation of a variable frequency oscillator;

generating a quadrature clock signal from the clock signal;

sampling the clock and quadrature clock signals at times corresponding to transition events in a data signal from which the clock signal is recovered;

determining phase quadrant values from the sampled clock and quadrature clock signals;

determining the existence of a frequency error from changes in successive values of phase quadrant values in accordance with a predetermined algorithm; and selectively generating a frequency error signal and inputting the frequency error signal to the phase-locked loop circuit to correct the frequency of oscillation of the variable frequency oscillator.

Circuits are also disclosed in accordance with the present invention for implementing the above methods.

BRIEF DESCRIPTION OF THE DRAWINGS

Embodiments of the present invention will now be described by way of example only and with reference to the accompanying drawings of which;

FIG. 5 is a schematic circuit diagram of a circuit to generate a quadrature clock signal, QCLOCK;

FIG. 5A is a graphical representation of the signals in FIG. 5;

FIG. 8 is a graphical representation of the manner in which phase quadrant values are derived from samples of clock and quadrature clock signals, showing the example where there is no frequency error;

FIG. 8A is a phasor diagram corresponding to the clock and data signals of FIG. 8;

FIG. 9 is a graphical representation of the derivation of phase quadrant values showing a phase quadrant change from B to C resulting from the clock signal being too fast;

FIG. 9A is a phasor diagram corresponding to the clock and data signals of FIG. 9;

DESCRIPTION OF THE PREFERRED EMBODIMENTS

Figure 1:
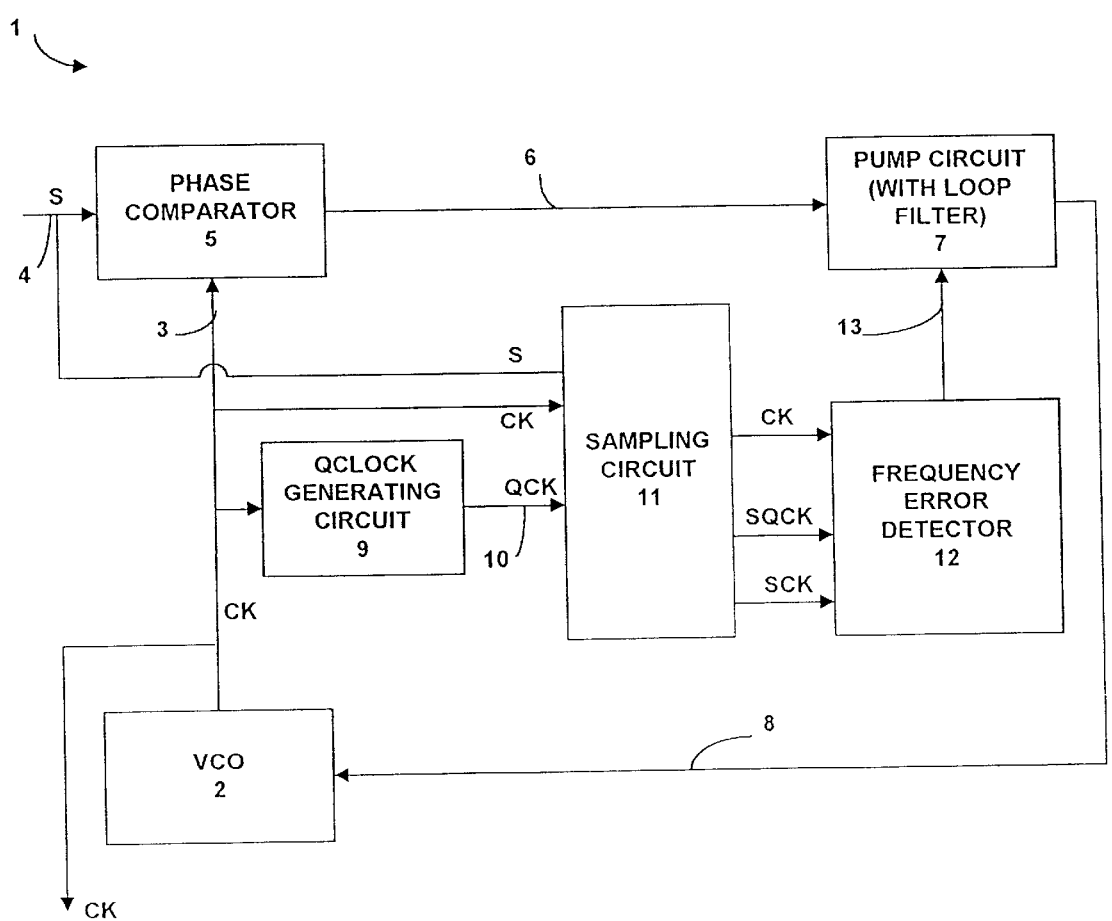
FIG. 1 is a schematic representation of a phase locked loop circuit having a phase comparator and pump circuit.
Figure 3:
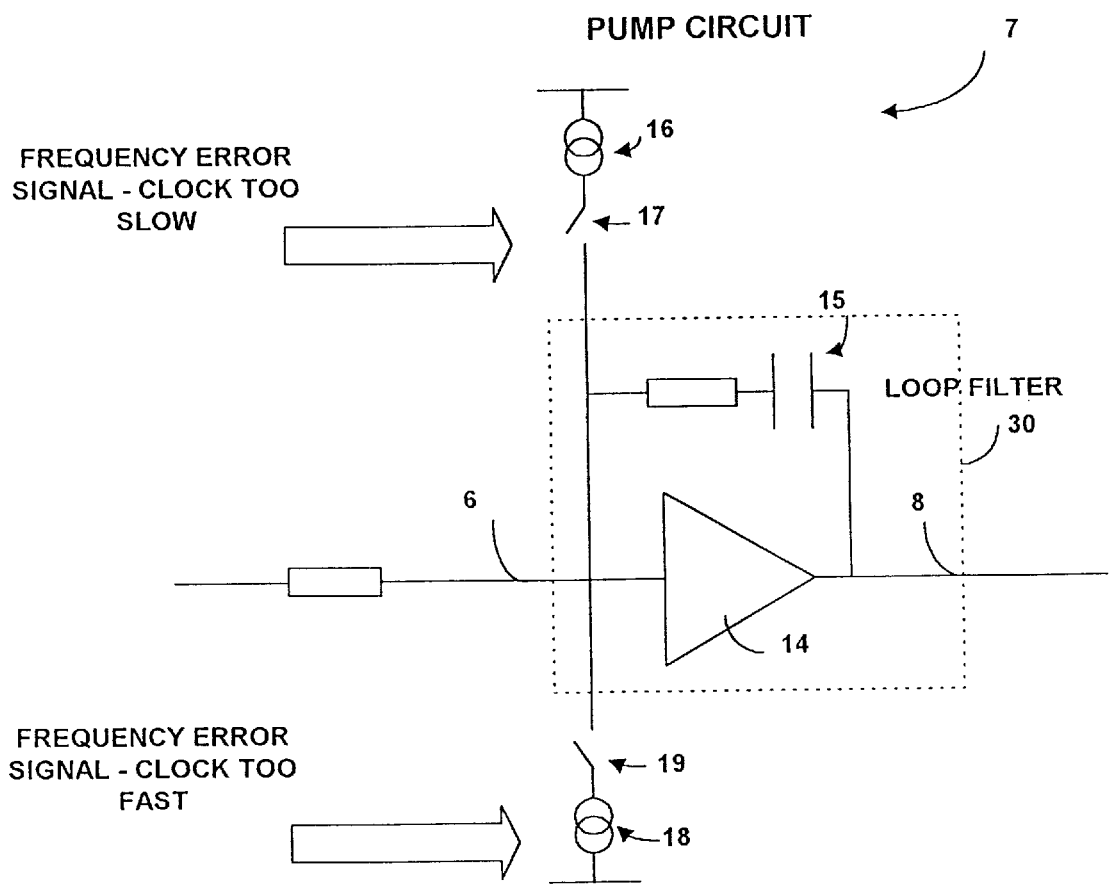
FIG. 3 is a schematic diagram of the pump circuit of FIG. 1.

FIG. 1 illustrates a phase locked loop circuit 1 having a variable frequency oscillator in the form of a voltage controlled oscillator (VCO) 2 which outputs a clock signal CK 3 for recovery of a data signal S 4. A phase comparator 5 receives signal data S and clock signal CK and outputs a phase error signal 6 to a charge pump circuit 7 which incorporates a loop filter 30 as shown in FIG. 3.

The charge pump circuit 7 outputs a control voltage 8 which is input to the VCO 2 so as to control the clock frequency f of the clock signal CK.

A quadrature clock signal generator 9 also receives the clock signal CK from the VCO 2 and generates a quadrature clock signal QCK 10 which is advanced by 90° phase relative to CK.

Both the clock signal CK and quadrature clock signal QCK are input to a sampling circuit 11 which samples both the clock and quadrature clock signals at each transition of the data signal S and outputs sample signals SCK and SQCK respectively to a frequency error detector 12. The frequency error detector 12 processes the samples to obtain a phase quadrant value A, B, C or D for each data transition and from successive phase quadrant values determines a frequency error signal 13 in accordance with a predetermined algorithm. The frequency error detector 12, in response to a frequency error being determined to exist, outputs the frequency error signal 13 to the charge pump circuit 7 so that the frequency error signal has an effect on the control voltage 8 tending to reduce the frequency error. The frequency error detector 12 determines the frequency error signal 13 according to an algorithm which ensures that, when the phase locked condition exists, the frequency error signal is disabled from driving the pump circuit 7 which then continues to be driven solely by the loop filter 30 in response to phase error signal 6.

Figure 2:
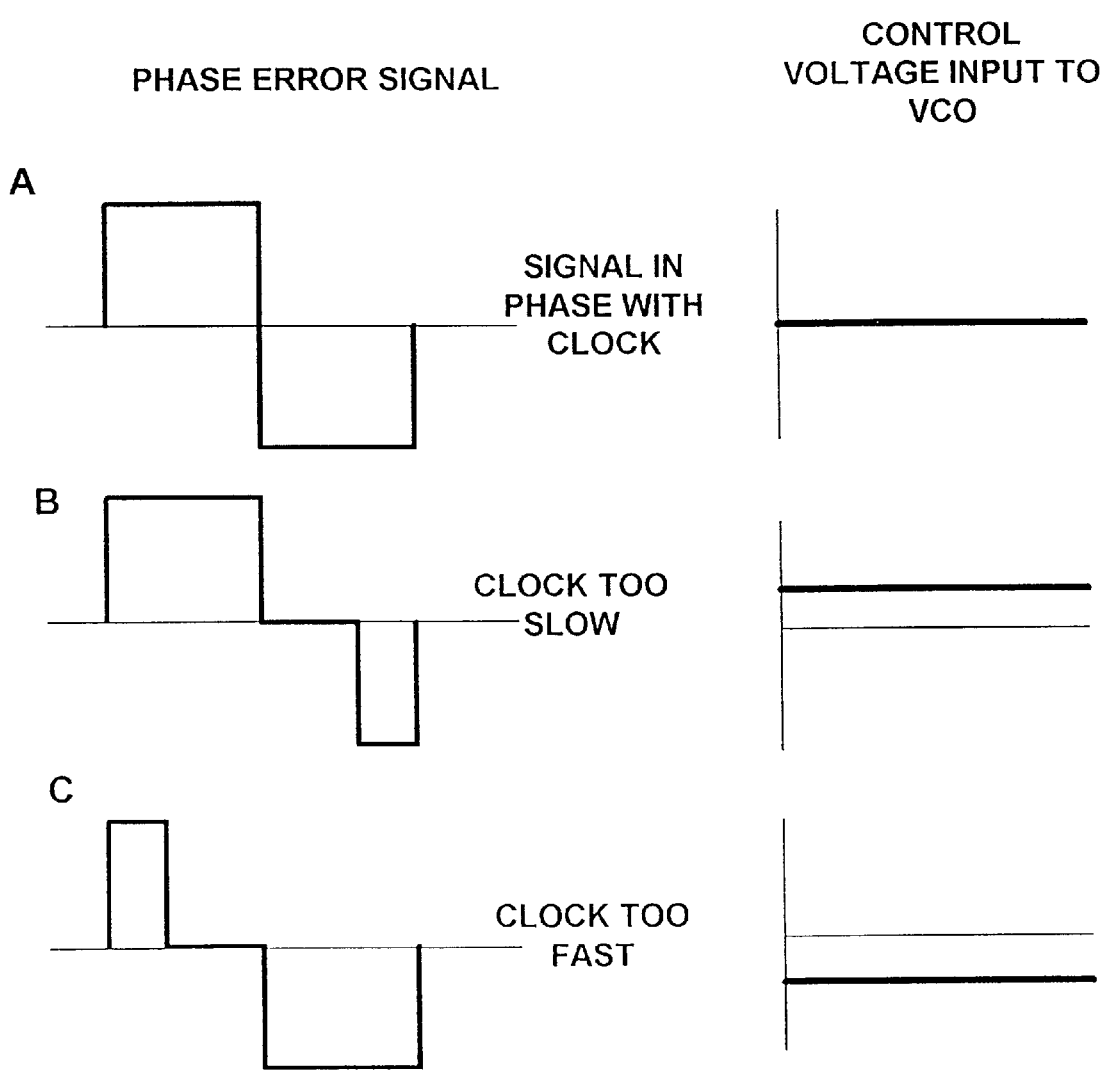
FIG. 2 is a graphical representation of the output of the phase comparator and pump circuit of FIG. 1.

In FIG. 2, the phase error signal 6 of FIG. 1 is illustrated graphically together with the control voltage 8 output from the pump circuit 7 and input to the VCO 2. Graph A of FIG. 2 shows that, when the signal and clock are in phase, the phase error signal 6 is a pulse width modulation (PWM) signal which is symmetrical in respect of positive and negative voltage peaks. As explained below, the loop filter 30 is configured as an integrator so that the net effect of phase error signal 6 of graph A on the loop filter 30 is zero. A zero control voltage 8 is therefore produced.

Curve B shows the effect of the clock lagging in phase as determined by the phase comparator 5, the positive and negative halves of the waveform being asymmetrical to produce a net positive control voltage 8. Similarly at graph C, the effect of the clock being advanced in phase as determined by the phase comparator 5 is to produce an asymmetrical waveform of the phase error signal 6 thereby producing a negative control voltage 8.

FIG. 3 shows schematically the way in which the frequency error signal 13 interacts with the pump circuit 7. The loop filter 30 is represented by an operational amplifier 14 configured as an integrator by connection in parallel with capacitor 15. The phase error signal 6 is input to the integrator and the integrator output is the control voltage 8 to the VCO 2. A current source 16 is connected to the integrator input via a first switch 17 responsive to a "too slow" frequency error signal 13 output from the frequency error detector 12 when the clock is determined to be too slow, the switch 17 then being closed to inject current for charging the capacitor 15. This has the effect of raising the control voltage 8 input to the VCO, corresponding to the VCO voltage in FIG. 2B.

A current drain 18 is similarly provided with a second switch 19 operable to connect the current drain to the input of the integrator in response to receipt of a "too fast" frequency error signal 13 corresponding to the clock being too fast, thereby draining charge from the capacitor 15 and regulating the control voltage 8 accordingly. This has the effect of lowering the control voltage input to the VCO, corresponding to the VCO voltage in FIG. 2C. FIG. 3 is schematic in that single ended signal lines are shown whereas in a practical embodiment pairs conductors carrying difference signals are preferably used.

Figure 4:
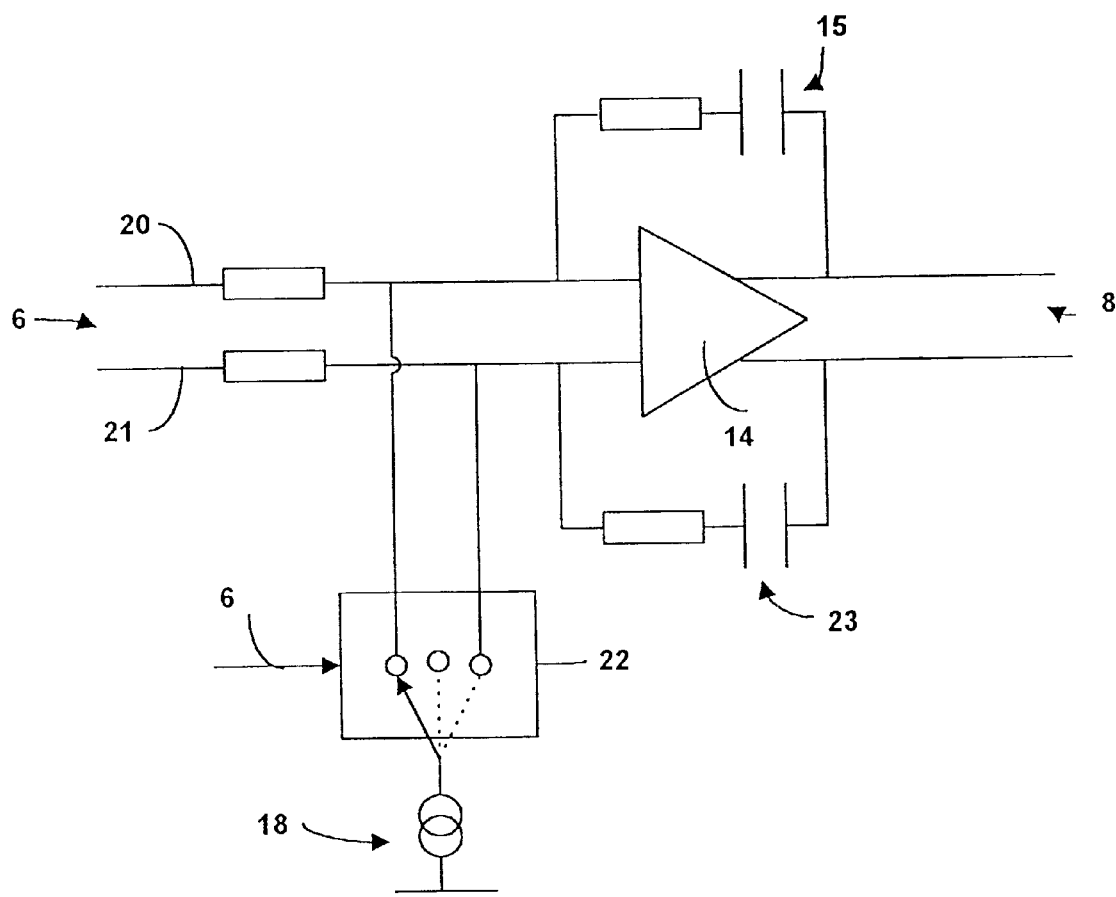
FIG. 4 is a circuit diagram of a further pump circuit in which difference signals are processed.

FIG. 4 illustrates a practical pump circuit and loop filter operating in response to difference signals such that the phase error signal 6 is represented by a voltage difference between signals lines 20 and 21 input to the operation amplifier 14. In this configuration, a single current drain 18 is selectively connectable to both signal lines 20 and 21 by a three position switch 22 responsive to the frequency error signal 13. An additional capacitor 23 is provided in parallel with the operational amplifier 14 and is connected to the second signal line 21, the capacitor 15 being connected in parallel with operational amplifier and connected to the first signal line 20.

In the first position of the switch 22 as shown, the current drain is connected to the first signal line 20 so as to discharge the first capacitor 15. In a central position of the switch 22, the current drain 18 is isolated from both signals lines 20 and 21 so as to correspond to a null frequency error signal, and in a third position of the switch the current drain 18 is connected to the second signal line 21 to drain charge from the second capacitor 23. The effect on the VCO control voltage 8 is therefore the same as for the circuit of FIG. 3.

Figure 15:
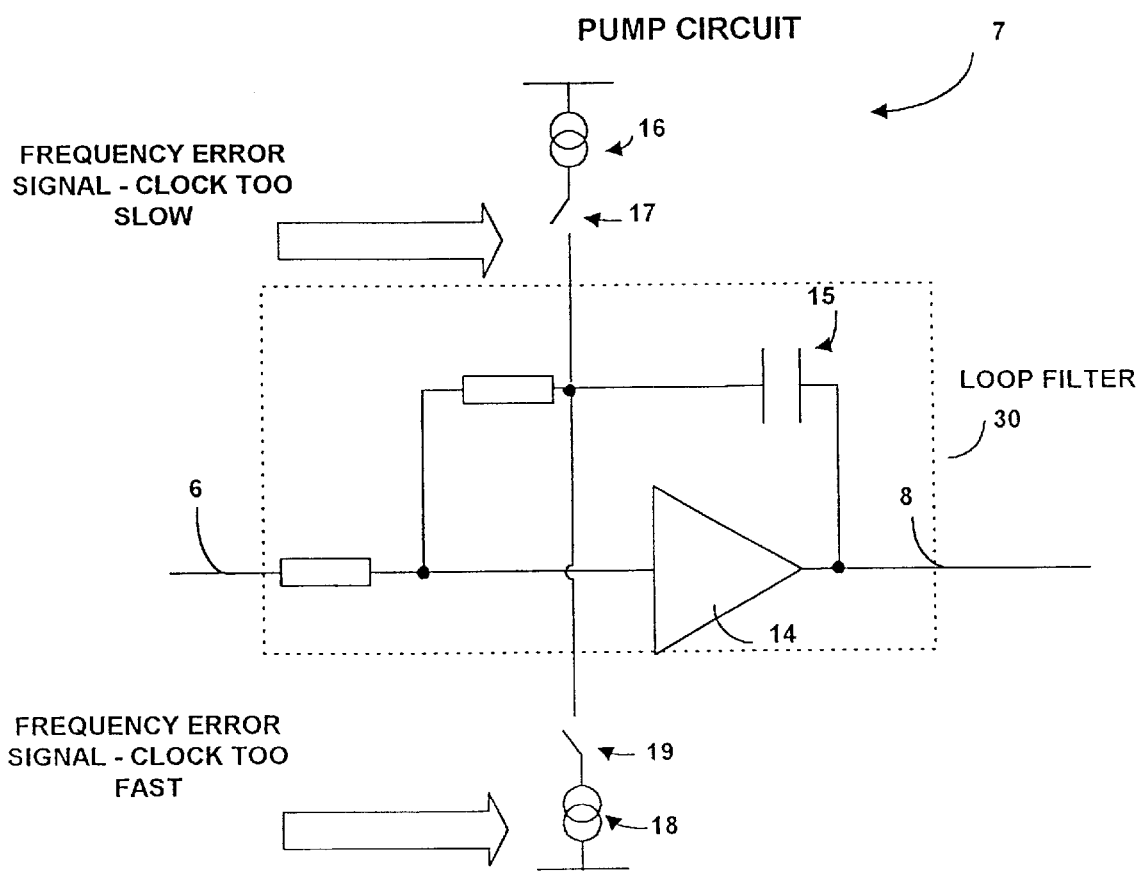
FIG. 15 is a schematic diagram of an alternative pump circuit producing the output shown in FIG. 14.

The circuit of FIG. 3 may be modified to provide a preferred pump circuit shown in FIG. 15 which differs from the pump circuit of FIG. 3 in the manner in which the current drain 18 is connected relative to the operational amplifier 14. In the pump circuit of FIG. 15, the current drain 18 is no longer connected directly to the input of the operational amplifier 14 but is connected directly to capacitor 15 so that loop filter resistance attenuates the effect of the current drain output, thereby creating a smaller change at the input of the operational amplifier 14 during the activation of the current drain in response to a "too fast" frequency error signal 13. Similarly, the current source 16 is connected to the input of the operational amplifier 14 via loop filter resistance with equivalent effect.

Figure 16:
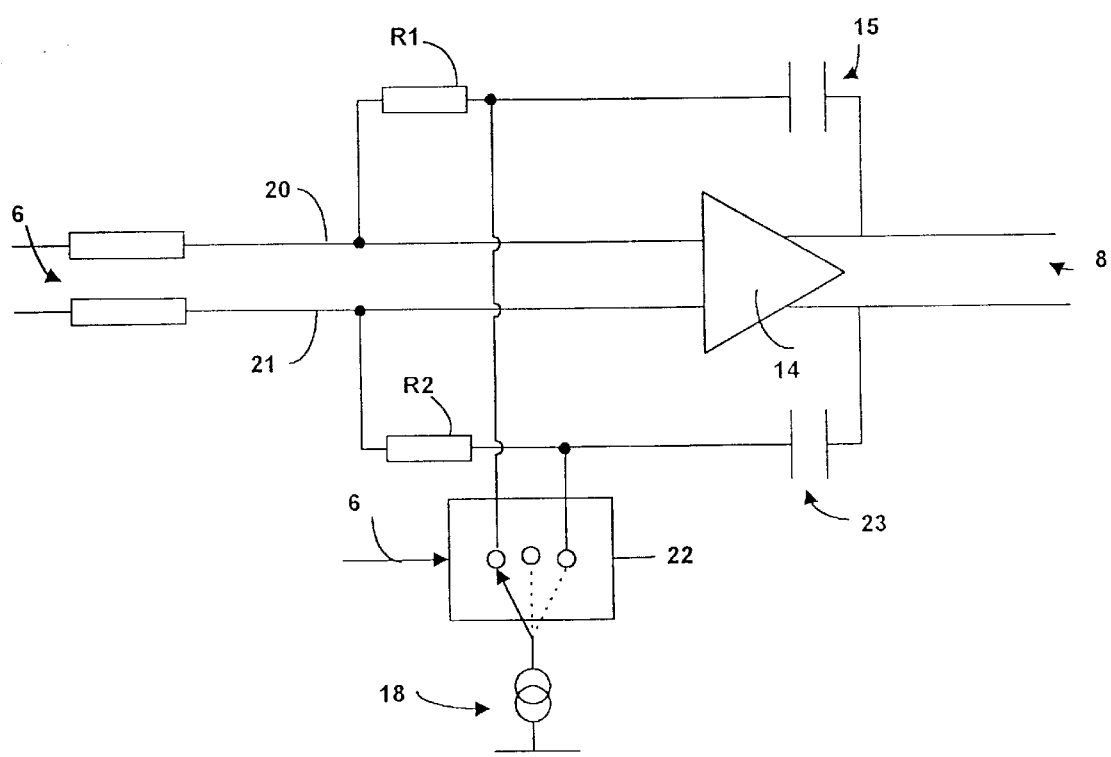
FIG. 16 is a circuit diagram with a further pump circuit corresponding in function to the circuit of FIG. 15 but in which difference signals are processed.

FIG. 16 shows a corresponding pump circuit configured for difference signals and in which loop filter resisters R1 and R2 provide attenuation to the output of the current drain 18 when connected for either "too fast" or "too slow" frequency error signals.

This attenuation may be important in many practical loop filter circuits since most operational amplifiers in such circuits have only a limited input voltage range. With the circuit configuration of FIG. 4, during activation in response to a frequency error signal, the unattenuated input from the current drain may have the effect of forcing the loop filter to malfunction if the input to the operational amplifier does not remain within the normal operating range of the operational amplifier.

FIG. 5 illustrates schematically the quadrature clock signal generator 9 which comprises first and second latches 24 and 25, each of which is a toggle D-type latch which is transparent when the control input is high and which, when the control input is low, outputs the previously latched signal level. A signal "2f CLOCK" 26 having a frequency which is twice that of the clock frequency f is input to the circuit 9, the inverse of the signal 26 being the control input to the first latch 24 and the signal 2f CLOCK also being input as a control signal to the second latch 25. The required clock and quadrature clock signals CK and QCK are obtained as illustrated graphically at FIG. 5A.

Figure 6A:
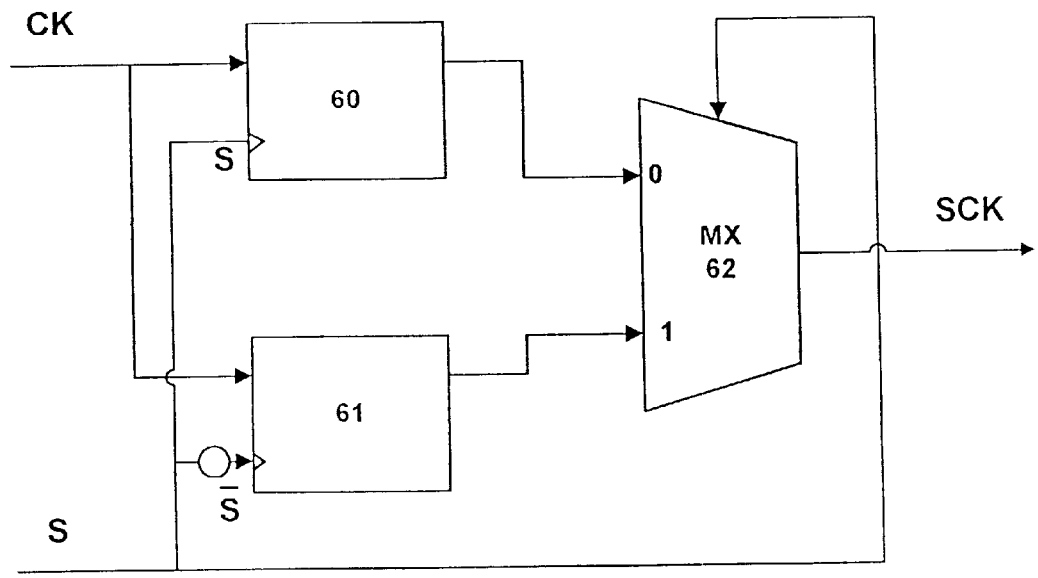
FIGS. 6A and 6B are schematic diagrams of sampling subcircuits for sampling the clock signal and quadrature clock signal respectively at data transitions.

FIG. 6A illustrates a sampling sub-circuit 70 for sampling the clock signal CK at each transition of the data signal S. First and second latches 60 and 61 are connected in parallel such that their outputs are input to a multiplexer 62 for which the data signal S is the output selecting signal. The clock signal CK is the input signal to each of the first and second latches 60 and 61, the first latch being enabled by the data signal S and the second latch 61 being enabled by the inverted data signal $\overline{S}$. Each of the latches 60 and 61 is transparent when enabled and holds the previously enabled valued when disabled. The first latch 60 is therefore clocked by positive going transitions of the data signal S and thereafter is in a transparent state until the next negative going transition sets the first latch into the hold state. The second latch 61 is clocked by negative going transitions of the data signal S and thereafter remains in the transparent state until the next positive going transition sets the second latch into the hold state.

At each transition of the data signal S, the multiplexer 62 selects the next alternate one of the first and second latches 60 and 61 such that the selected latch always corresponds to whichever of the latches is currently disabled i.e. in the hold state. In this way the output of the multiplexer 62 is always equal to the value of the clock signal CK at the instant of a transition event in the data signal S. The output SCK is the sampled clock signal which is input to the frequency error detector 12 of FIG. 1.

Figure 6B:
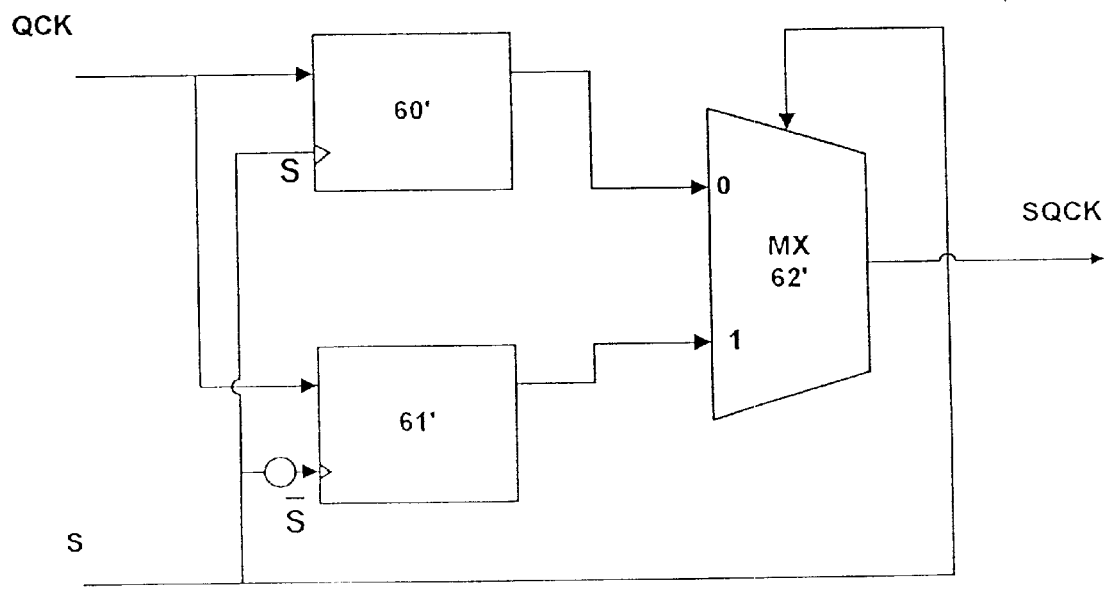

FIG. 6B also shows a corresponding sampling subcircuit 71 for sampling the quadrature clock signal QCK to obtain sampled quadrature clock signal SQCK.

Figure 7:
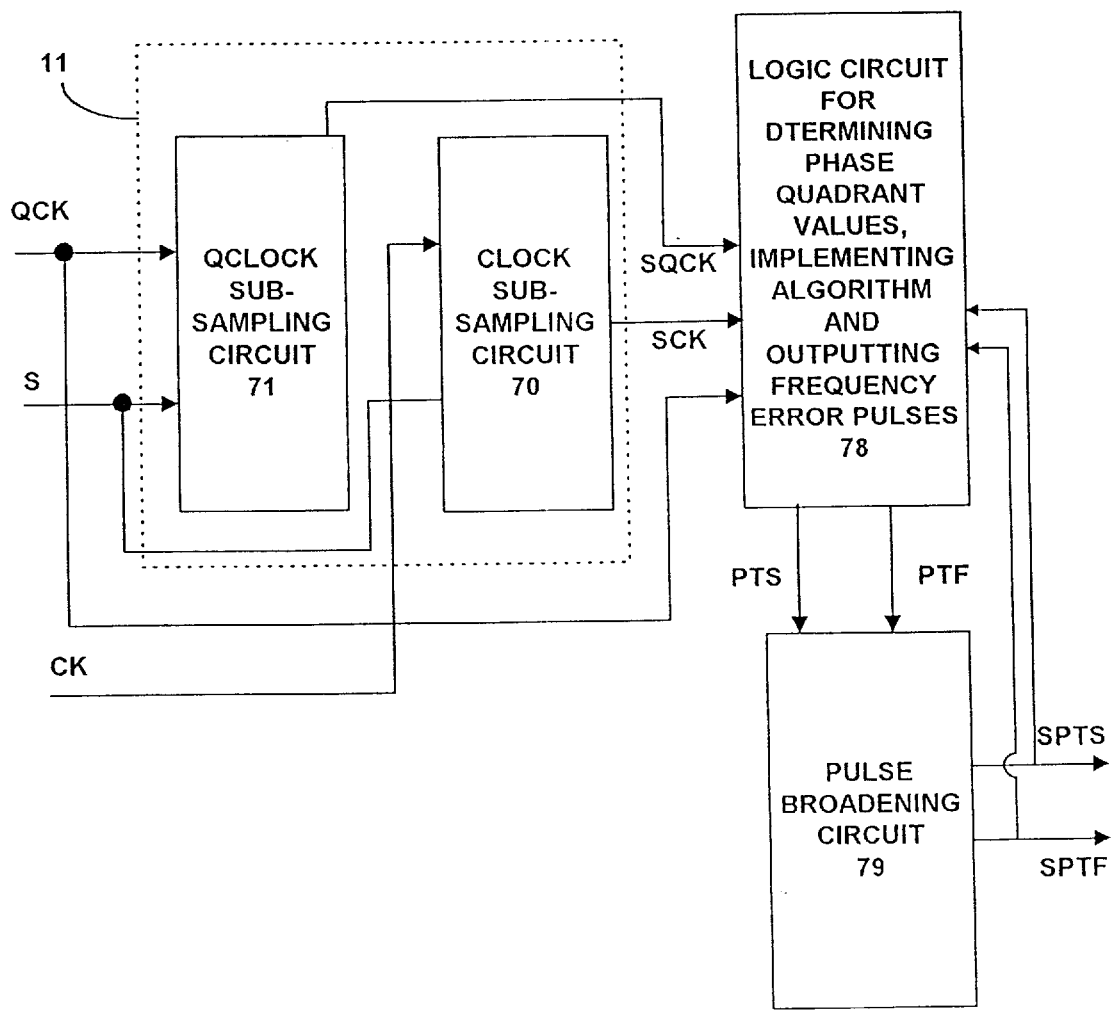
FIG. 7 is a schematic circuit diagram showing the generation of the frequency error signal based on the outputs of sampling subcircuits for the clock and quadrature clock signals.

FIG. 7 illustrates the manner in which the sampling circuit 11 and frequency error detector 12 of FIG. 1 are implemented in practice, the sampling circuit being constituted by the clock sampling subcircuit 70, as shown in detail in FIG. 6A, and the quadrature clock sampling subcircuit 71 of FIG. 6B. The sampling circuit 11 has as its output therefore the sampled clock signal SCK and the sampled quadrature clock signal SQCK which are processed in the logic circuit 78 to determine phase quadrant values.

Figure 10:
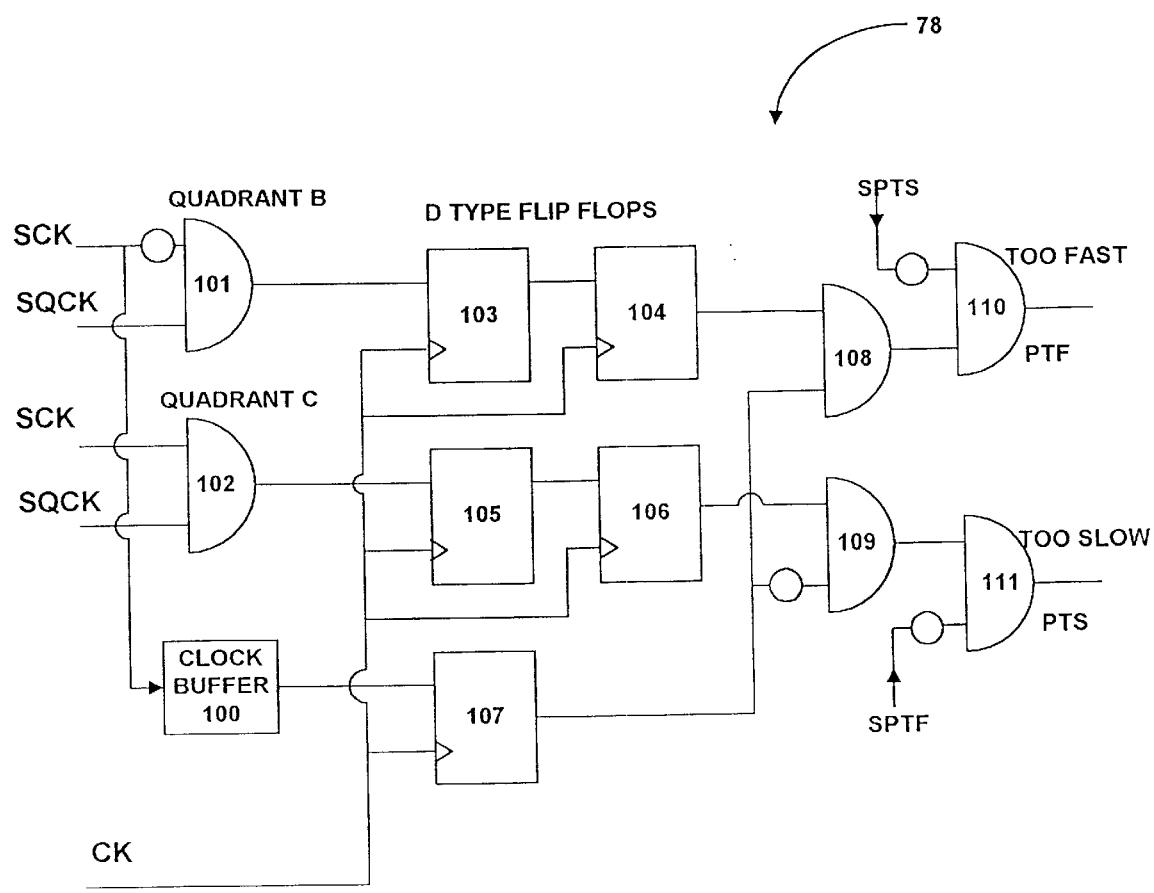
FIG. 10 is a schematic circuit diagram of a frequency error detector circuit generating the frequency error signal.

The output of the logic circuit 78 using the implementation of FIG. 10 produces pulses PTF and PTS representing "too fast" and "too slow" frequency error signals which have a pulse length corresponding to one clock cycle. A pulse broadening circuit 79 is used to extend the length of the pulses PTF and PTS to four clock cycles in order to achieve current pulses which will propagate successfully at frequencies in the GHz range. In FIG. 7, the pulse broadening circuit 79 is shown to output signals SPTS and SPTF which are stretched pulses corresponding to inputs PTS and PTF. The effect of inductance due to the physical dimensions of component leads may thereby be overcome.

FIG. 8 illustrates graphically the manner in which the clock and quadrature clock signals CK and QCK are sampled to obtain phase quadrant values. Phase quadrant values A, B, C, D are defined by a logical combination of the clock and Q clock signals CK and QCK such that the transition between quadrants A and D corresponds to the clock and data being in phase, as shown in the phasor representation of FIG. 8A. In FIG. 8, first and second transitions 72 and 73 in the data signal S each occur in phase quadrants having quadrant value D, as illustrated by the heavy broken lines showing correspondence between the data signals, clock CK and quadrature QCK clock signals. FIG. 8 represents an example of a condition in which the frequency f of the clock signal CK is closely matched to twice the data rate but in which there remains a phase error represented by the displacement between each of the transitions 72 and 73 and the respective transition 76 and 77 between quadrants A and D. In this condition, generation of a frequency error signal 13 is not required and the phase error signal 6 generated by the phase comparator 5 of FIG. 1 will suffice to achieve and maintain the phase locked condition.

FIG. 8 therefore represents the post acquisition phase in which the frequency error detector 12 is disabled from affecting the pump circuit 7.

FIG. 9 illustrates a further example in which the clock frequency f is too fast. In this example, the first transition 74 of the data signal occurs in a phase quadrant having phase quadrant value B and the second transition 75 occurs in a phase quadrant having value C. As illustrated in the phasor diagram of FIG. 9A, the phasor 80 representing the data signals continues to rotate relative to the phasor 81 representing the clock signal CK because of the existence of a frequency difference between the clock and data signals. (For the condition in which the clock signal is too slow, the direction of rotation of the data signal phasor 80 relative to the clock phasor 81 would be reversed).

The frequency error detector 12 of FIG. 1 operates in accordance with the algorithm implemented by logic circuit 78 and which defines a protocol by which successive phase quadrant values are interpreted in order to determine the appropriate response of the frequency error detector 12. According to this protocol, a change of quadrant value from A to D or from D to A is consistent with minor deviation from the phase locked condition and therefore does not merit the output of a frequency error signal i.e. a null output signal is required. Similarly, transitions between A and B in either direction (or C to D in either direction) could be consistent with jitter in the data signal and are therefore ignored by the frequency error detector 12.

Quadrant value transitions from B to C or from B to D are however interpreted as being consistent with the clock signal being too fast and the frequency error detector 12 outputs a "too fast" frequency error signal 13 (SPTF) to the pump circuit 7. Similarly, quadrant value transitions from C to B or from C to A are interpreted as being consistent with a frequency error condition in which the clock signal is too slow and the frequency error detector 12 outputs a "too slow" frequency error signal 13 (SPTS) to the pump circuit 7.

The above algorithm enables the phase locked loop to achieve tolerance to jitter and effectively disables the frequency error detector 12 once the acquisition phase is complete and a phase locked condition exists.

An advantage of employing an algorithm in which a different protocol is adopted for the "too fast" and "too slow" directions of phase quadrant transition is that the algorithm improves resistance to self oscillation in the phase locked loop circuit when the frequency error detector 12 is operating.

The frequency error signal 13 may be generated using logic circuitry of the form shown in FIG. 10 in which D type flip-flops are used.

In FIG. 10, gate 101 receives as inputs the inverse of the sampled clock signal SCK and the sampled quadrature clock signal SQCK and serves to detect the occurrence of a data transition in clock phase quadrant B.

Gate 102 has as its inputs the sampled clock signal SCK and sampled quadrature clock signal SQCK and serves to detect a data signal transition in quadrant C.

Flip-flops 103 and 105 sample and store the outputs of gates 101 and 102 respectively for the duration of the current clock cycle. Additional flip-flops 104 and 106, also clocked by the clock signal CK, receive as inputs the outputs of flip-flops 103 and 105 respectively and store the outputs for the duration of a further clock cycle.

Clock buffer 100 receives as its input the sampled clock signal SCK, the output of the clock buffer being stored for the duration of the current clock cycle in flip-flop 107.

Gate 108 receives as its inputs the outputs of flip-flops 104 and 107 and similarly gate 109 receives as its inputs the output of flip-flop 106 and the inverse of the output of flip-flop 107.

The output of gate 108 is gated with the inverse of SPTS, the stretched "too slow" signal PTS, and the output, when true, gives the frequency error detector output "too fast" PTF.

Similarly, the output of gate 109 is gated with SPTF, the inverse of the stretched "too fast" signal PTF, and has as its output, when equal to logic 1, the frequency error detector "too slow" signal PTS.

In use, SCK and SQCK correspond to stored values of the state of CK and QCK as sampled during the last transition of the data waveform as illustrated in FIGS. 8 and 9. Gate 101 detects whether the last data transition occurred in phase quadrant B, resulting in the output of gate 101 being logic state 1.

Gate 102 detects whether the last data transition occurred in phase quadrant C, in which case the output of gate 102 changes to logic state 1.

Flip-flops 103 and 105 sample and store these signals which represent detected phase quadrant values for the duration of the current clock cycle, the flip-flops being clocked by signal CK. Similarly, flip-flop 107 samples and stores the values of SCK for the duration of the current clock cycle.

Flip-flops 104 and 106 propagate the logic states sampled by flip-flops 103 and 105 for a further clock cycle so that their outputs represent samples for the previous clock phase, i.e. representing the state of the previous data transition samples.

The circuit of FIG. 10 thereby functions to produce a pulse of the duration of one clock cycle of CK at the output of gates 108 or 109 when a quadrant phase value change within the definition of the predetermined algorithm occurs. A quadrant change from B to either C or D results in gate 108 outputting a pulse corresponding to logic state 1 having a duration equal to one cycle of the clock signal CK. Gate 109 detects a change from quadrant C to quadrant B or A by outputting a similar pulse. Other quadrant value changes such as A to B do not result in an output pulse.

The output of gate 108 is gated in a further gate 110 with the inverted SPTS signal so that the resulting "too fast" output signal from gate 110 cannot be simultaneously generated while the stretched signal SPTS continues to be output from the pulse broadening circuit 79. Similarly, the output of gate 109 is gated in a further gate 111 with the inverse of stretched signal SPTF to prevent the "too slow" signal output from gate 111 being generated simultaneously with the output from the pulse broadening circuit of SPTF.

The gates 110 and 111 of FIG. 10 also function to reduce the effects of jitter under certain circumstances. Data jitter, the random edge movement of the data edge, could for example result in detection at the outputs of gates 108 and 109 of a transition from quadrant B to C being followed immediately by a detection of transition from quadrant C to B. The initial transition results in a "too fast" signal being output from gate 110 which is stretched by the pulse broadening circuit 79. The subsequent transition from C to B results in the output of gate 109 being logic state 1 but, since this signal is gated in gate 111 with the inverse of SPTF, the stretched "too fast" signal, the output of a corresponding "too slow" signal is prevented for this transition. It is generally the case that, in the presence of such jitter, the first transition produces the correct response from the frequency detector circuit so that suppression of the second transition improves immunity to jitter.

Figure 13:
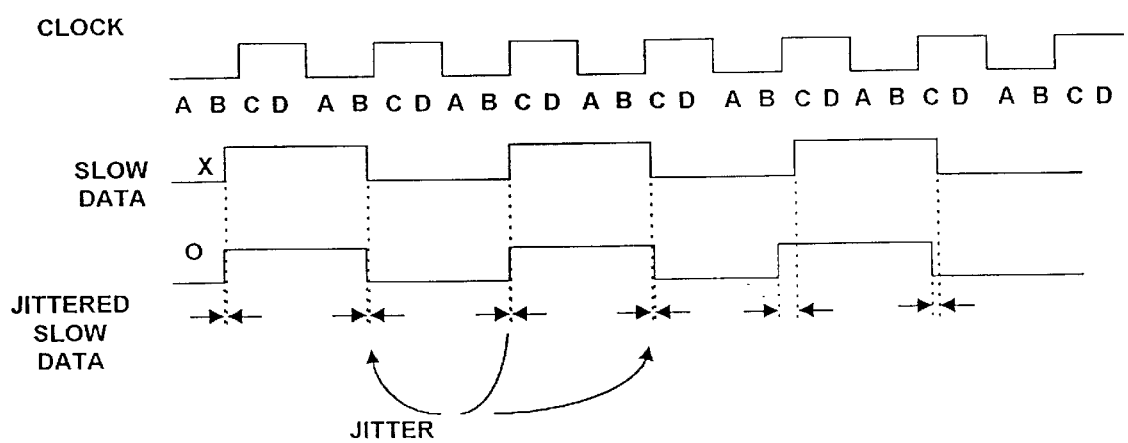
FIG. 13 is a graphical representation of clock, slow data and jittered slow data waveforms.
Figure 13A:
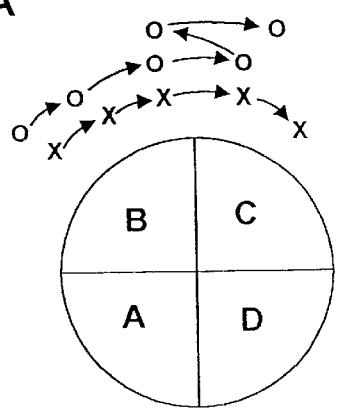
FIG. 13A is a phasor diagram corresponding to the waveforms of FIG. 13.
Figure 14:
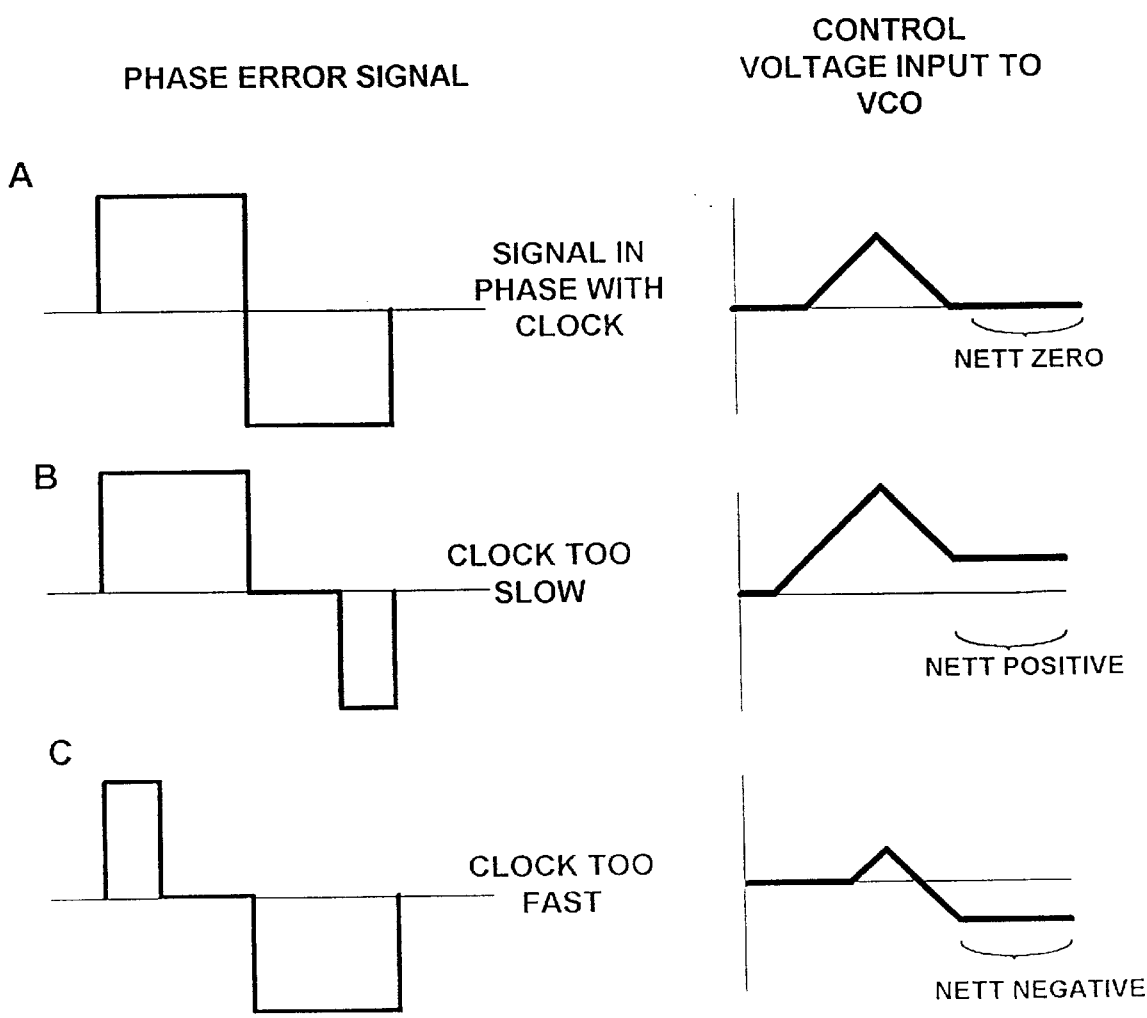
FIG. 14 is a graphical representation of the output of a phase comparator and pump circuit of an alternative embodiment.

FIGS. 13 and 13A illustrate the need for the above gates 110 and 111 to counter the effects of jitter. FIG. 13 illustrates a waveform corresponding to slow data subject to jitter, and also shows for comparison a slow data waveform without jitter. FIG. 13A shows the progress of phase quadrant values in a phasor diagram for the jittered slow data represented by data points O, and for comparison, the data without jitter represented by data points X. At the transition from quadrant value B to C, the first transition made by data points O of the jittered data is the correct transition whereas the subsequent transition from C to B is a manifestation of jitter.

The function of the gates 110 and 111 described above prevents this manifestation of jitter from causing an incorrect response to the generated by the frequency detector circuit.

In order to avoid possible aliasing effects which could occur when the data signal frequency is grossly different from the local clock frequency, the operating range of the VCR2 is preferably limited so as to constrain the frequency of CK to be close to the expected signal frequency.

Figure 12:
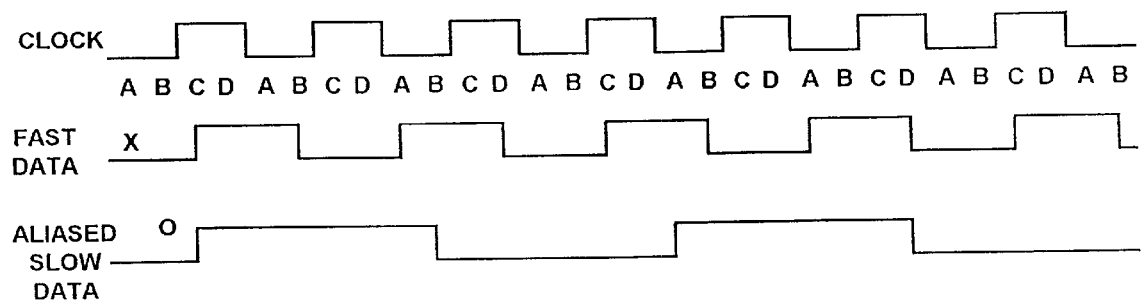
FIG. 12 is a graphical representation of the relation between clock, fast data and aliased data waveforms.
Figure 12A:
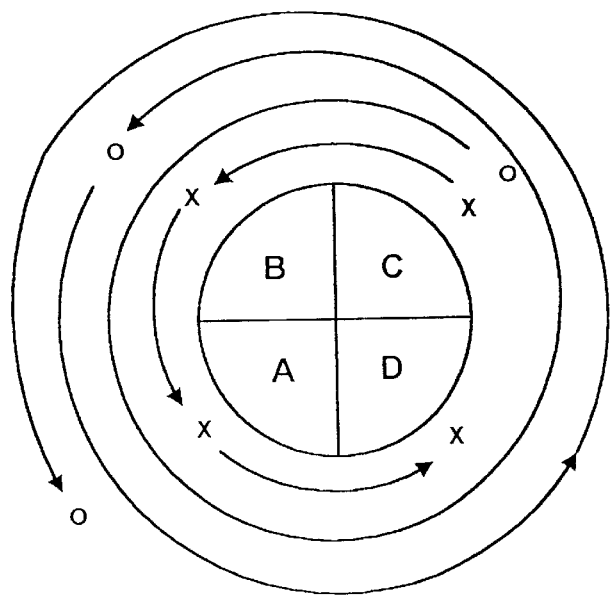
FIG. 12A is a phasor diagram corresponding to the waveforms of FIG. 12.

Such aliasing effects are illustrated in FIGS. 12 and 12A. In FIG. 12, slow data represented by waveform O is sufficiently slow to be subject to aliasing. For comparison, fast data waveform X is shown to have the same series of phase quadrant values C, B, A, D. These are represented in the phasor diagram of FIG. 12A which illustrates that the effect of aliasing is to give the slow data the same series of phase quadrant values as fast data.

In order to prevent false reading of the phase quadrant values in the presence of aliasing, the above mentioned frequency constraint on the operating range of the oscillator is preferably provided.

Figure 11:
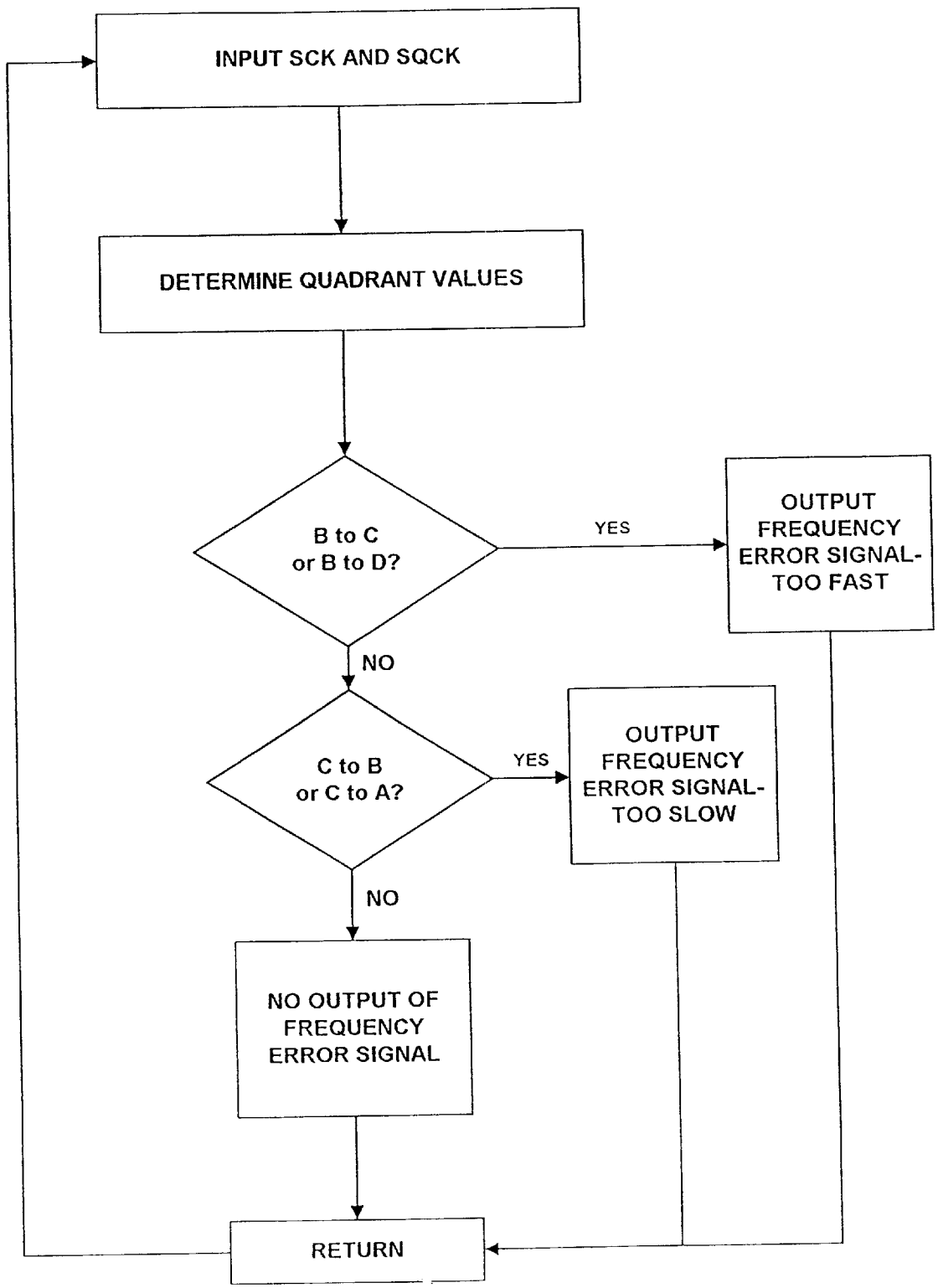
FIG. 11 is a flow chart of an algorithm for determining the frequency error signal.

FIG. 11 shows in flow chart form the algorithm referred to above defining the protocol by which the frequency error signal is generated.

As illustrated in FIG. 7, a logic circuit 78 implements the above algorithm and outputs frequency error pulses PTF and PTS depending on whether a "too fast" or a "too slow" frequency condition exits. The logic circuit 78 may additionally output a further signal indicating no input to the pump circuit 7, i.e. corresponding to a null frequency error signal, for control of the switch 22 of FIG. 4.

What is claimed is:

1. A method of sampling a clock signal in a clock recovery circuit at times corresponding to transition events between first and second values of a data signal from which the clock signal is recovered, the method comprising the steps of;

inputting the clock signal to a first latch switched by the data signal to be in a transparent state when the data signal has the first value and a hold state when the data signal has the second value;

inverting the data signal and inputting the clock signal to a second latch clocked by the inverted data signal to be in a transparent state when the data signal has the second value and a hold state when the data signal has the first value; and multiplexing outputs of the first and second latches to select one of said outputs according to the value of the data signal to obtain a sampled output signal corresponding to the output of whichever one of the first and second latches is in the hold state.

2. A method as claimed in claim 1, wherein the first and second latches comprise transparent D type latches.

3. A sampling subcircuit for sampling a clock signal in a clock recovery circuit at times corresponding to transition events between first and second values of a data signal from which the clock signal is recovered;

the sampling subcircuit comprising a first latch having a data input connected to receive the clock signal and a control input connected to receive the data signal whereby the first latch is switchable by the data signal to be in a transparent state when the data signal has the first value and a hold state when the data signal has the second value;

inverting means operable to invert the data signal to produce an inverted data signal;

a second latch having a data input connected to receive the clock signal and having a control input connected to receive the inverted data signal whereby the second latch is switchable to be in a transparent state when the data signal has the second value and a hold state when the data signal has the first value;

and a multiplexer connected to receive outputs of the first and second latches and operable to select one of said outputs according to the value of the data signal so as to output a sampled output signal equal to the output of whichever of the first and second latches is in the hold state.

4. A sampling subcircuit as claimed in claim 3, wherein the first and second latches are transparent D type latches.

5. A phase locked loop circuit for use in recovering a clock signal from a received data signal in a clock recovery system, the phase locked loop circuit comprising a sampling subcircuit according to claim 3.

* * * * *